United States Patent [19]
Masterson

[11] Patent Number: 5,935,397
[45] Date of Patent: Aug. 10, 1999

[54] PHYSICAL VAPOR DEPOSITION CHAMBER

[75] Inventor: Sean P. Masterson, Costa Mesa, Calif.

[73] Assignee: Rockwell Semiconductor Systems, Inc., Newport Beach, Calif.

[21] Appl. No.: 09/070,314

[22] Filed: Apr. 30, 1998

[51] Int. Cl.[6] .................................................. C23C 14/00
[52] U.S. Cl. .............................. 204/298.12; 204/298.25; 204/298.02; 204/192.1; 204/192.12
[58] Field of Search .................... 204/298.12, 298.01, 204/298.02, 298.19, 298.25, 192.1, 192.12, 298.11; 156/345; 118/715

[56] References Cited

U.S. PATENT DOCUMENTS

| 3,830,721 | 8/1974 | Gruen et al. | 204/192.12 |
|---|---|---|---|
| 3,878,085 | 4/1975 | Corbani | 204/192.12 |
| 4,198,283 | 4/1980 | Class et al. | 204/298.12 |
| 4,761,218 | 8/1988 | Boys | 204/298.19 |
| 5,112,469 | 5/1992 | Kempf et al. | 204/298.25 |
| 5,328,582 | 7/1994 | Cole | 204/298.11 |
| 5,330,628 | 7/1994 | Demaray et al. | 204/298.11 |
| 5,690,795 | 11/1997 | Rosenstein et al. | 204/192.12 |
| 5,772,858 | 6/1998 | Tepman | 204/298.11 |

Primary Examiner—Nam Nguyen
Assistant Examiner—Gregg Cantelmo
Attorney, Agent, or Firm—Joseph W. King Jr.

[57] ABSTRACT

A physical vapor deposition chamber assembly is provided for use in depositing metal particles onto a wafer placed inside the chamber assembly. The physical vapor deposition assembly includes a chamber having an opening, and a target containing a desired metal to be deposited on a wafer placed inside the chamber, with the target adapted to be secured at the opening of the chamber. The assembly further includes an insulator positioned along the boundary of the opening, and having opposing first and second surfaces, with the second surface having a ridge extending therealong and defining a narrow horizontal ridge surface. A first O-ring is positioned between the first surface of the insulator and the chamber along the boundary of the opening, and a second O-ring is positioned between the ridge surface of the insulator and the target.

28 Claims, 2 Drawing Sheets

PHYSICAL VAPOR DEPOSITION CHAMBER

BACKGROUND OF THE INVENTION

1. Field of the Invention

The present invention relates generally to semiconductor wafer processing apparatus, and in particular, to an improved physical vapor deposition chamber that reduces the amount of unwanted or undesirable metal particles that may be introduced into the chamber during processing of the wafer.

2. Background Art

Semiconductor wafer processing is a complex procedure performed by semiconductor wafer processing systems that can include many chambers where the semiconductor wafers are processed. An example of an available semiconductor wafer processing system is the Endura 5500 that is currently made by Applied Materials, Inc. which is located at 3050 Bowers Avenue in Santa Clara, Calif. Although there are other currently-available semiconductor wafer processing systems, all of these systems include similar chambers and process the wafers in similar manners.

FIG. 1 is a top view of the Endura 5500 system 10. Referring to FIG. 1, the system 10 includes a plurality of chambers, described in detail below, and two robot devices that move the wafers from one chamber to another. The system 10 has two wafer load locks 12, 14 into which wafers are loaded at the beginning of, and at the end of, the processing inside system 10. In particular, plastic cassettes can be placed into these locks 12, 14, with the plastic cassettes adapted to hold the wafers. In operation, a cassette holding a number of wafers is first placed into the first load lock 12 by an operator. A first robot device 16 then removes the wafers from the first load lock 12 and places the wafers into an "orient and de-gas" chamber 18. The "orient and de-gas" chamber 18 orients the notch on the wafers and desorbs gas from the wafers while also slightly pre-heating the wafers. Thereafter, the first robot device 16 removes the wafers from the "orient and de-gas" chamber 18 and places the wafers into one of three etch chambers 20a, 20b or 20c, where an etch can be applied (if necessary) to the wafers, such as through the use of RF plasma.

After etching, a second robot device (not shown) located under top cover 22 removes the wafers from the etch chamber 20c and places the wafers into one or more selected physical vapor deposition (PVD) chambers 24a, 24b, 24c, 24d. Each PVD chamber 24 applies a different type of metal (e.g., titanium, titanium nitride 101, aluminum, titanium nitride clamped, among others) to the wafers to form the interconnect metal lines. The application of metal is done at high temperatures, such as from 200 to 300 degrees Celsius in the Endura 5500 system. If it is desired to apply only one type of metal to the wafers, then the wafers are only placed in the one chamber 24a, 24b, 24c or 24d containing that type of metal. Similarly, if it is desired to apply three types of metal to the wafers, then the wafers are only placed in the selected chambers 24a, 24b, 24c or 24d containing the three specific types of metal. Likewise, if it is desired to apply four types of metal to the wafers, then the wafers are sequentially placed in all the chambers 24a, 24b, 24c and 24d. The second robot device simply removes the wafers from one chamber 24 and places the wafers into the next desired chamber 24, and repeats this operation until the wafers have been processed in all the desired PVD chambers 24. In other semiconductor wafer processing systems, it is possible to provide any number of these PVD chambers, with such number typically ranging from one to six.

When all the desired metal types have been applied to the wafers, the second robot device will remove the wafers from the last PVD chamber 24 where metal was applied, and places the wafers into a cool chamber 26, where the wafers are cooled. A gas, such as Argon, is introduced into the cool chamber 26 to produce a conduction medium to pull heat away from the wafers. The wafers must be cooled after processing, otherwise the high temperature of these wafers will melt the plastic cassettes that are located in the second wafer load lock 14. After cooling, the first robot device 16 picks up the wafers, removes them from the cool chamber 26, and places the wafers into cassettes in the second wafer load lock 14, where the wafers are stored until removed by the operator of the system 10.

The PVD chambers 24 have a generally square configuration (with rounded corners) with a generally oblong opening or mouth. Referring to FIG. 2, the mouth or opening of the PVD chamber 24 is defined by a spacer 30, which is typically bolted or otherwise attached to the wall of the chamber 24. The spacer 30 is generally made of a metal, such as aluminum or stainless steel. The spacer 30 is used to receive an insulator 44 (described below) and to adjust the heater of the system 10 to target spacing distance. A target 32 is placed over the insulator 44 which is in turn placed within a groove 52 of the spacer 30. The target 32 is the metal that is to be sputtered for deposition onto the wafers, and examples of such metals can include titanium, titanium nitride 101, aluminum, and titanium nitride clamped, among others. The target 32 is typically provided in a circular shape having a trapezoidal central portion 34 and an annular flange 36. In one example, the central portion 34 has two inclined or angled walls 38, 40. The flange 36 is provided as an overhang to fit over the spacer 30, so that the central portion 34 can extend through the opening of the chamber 24 defined by the spacer 30. The target 32 can be provided either in the form of one piece of the desired metal, or in a "diffusion bonded" manner, where the desired metal shaped as the central portion 34 is attached to a backing (made of aluminum or other materials) that extends throughout the top 42 of the target 32 and includes the flange 36. A "diffusion bonded" target 32 is lower in cost since the entire piece of the target 32 does not need to be made of the desired metal, which can be more expensive than aluminum or the selected material. A fiberglass composite top is then provided over and bolted to the backing (i.e., the top 42) of the target 32. When the PVD chamber 24 is in use, water is typically used to cool the back side (i.e., the top 42) of the target 32 to minimize warping of the target 32, and to prevent the target 32 from melting.

An insulator 44 is provided between the target 32 and the spacer 30 to isolate the "cathode" (i.e., the target 32) from the "anode" (i.e., the spacer 30). In particular, the insulator 44 partially sits in a groove 52 provided in the spacer 30. This isolation is required to provide a voltage potential between the anode and the cathode. This insulator 44 can be a ceramic material, such as alumina. The insulator 44 also operates as a vacuum sealing surface. In addition, a first O-ring 46 is provided to separate the insulator 44 and the spacer 30, and a second O-ring 48 is provided to separate the insulator 44 and the flange 36 of the target 32. The O-rings 46, 48 are provided as a seal to prevent leaks.

The structure of the PVD chamber 24 shown and described in FIG. 2 suffers from the drawback that undesirable metal particles from the target 32 may be discharged into the interior of the PVD chamber 24. Since a vacuum is pulled towards the inside of the PVD chamber 24 in the direction of arrow 50 when the PVD chamber 24 is in use (the vacuum is pulled to reduce impurities), the O-rings 46, 48 tend to be compressed and typically will collapse to a point where the opposite sides of the insulator 44 contact the target 32 (at the flange 36) and the spacer 30. The contacting surfaces undergo slight side-to-side movement caused by a chamber vibration, pumping and venting of the PVD chamber 24, and deformation changes in the O-rings 46, 48 when the chamber is periodically opened for preventative maintenance (also known as the initial pump-down sequence). In addition, since the materials used for the target 32 (e.g., a metal), the insulator 44 (e.g., ceramic) and the spacer 30 (e.g., aluminum) have different thermal expansion rates, the linear compression created by reducing the chamber pressure and the side-to-side movement causes particles from the target 32 to be imbedded into the material of the insulator 44. As a result, when the entire assembly illustrated in FIG. 2 (including the insulator 44 material) is re-heated during the processing of the next batch of wafers, further abrasive activity resulting from the side-to-side movement of contacting surfaces may cause the previously imbedded particles to fall off from the insulator 44 and to be deposited into the PVD chamber 24. It is also believed that the embedded metal particles may cause the material of the insulator 44 to become semi-conductive, thereby creating a "micro-arc" (i.e., a small isolated discharge) which might result in the further discharge of undesirable particles into the PVD chamber 24.

The discharge of unwanted metal particles into the PVD chamber 24 results in reduced product yield because such discharge will increase the deposit of non-homogeneous metal onto the wafers, thereby producing defective or otherwise unusable dies on a chip produced from the wafer. These undesirable particles can further reduce or break predetermined conductive paths.

Thus, there still remains a need for an improved PVD chamber that reduces the amount of unwanted or undesirable metal particles that may be introduced into the chamber during processing of the wafers.

SUMMARY OF THE INVENTION

The present invention provides a PVD chamber that reduces the amount of unwanted or undesirable metal particles that may be introduced into the chamber during processing of the wafer. In particular, the present invention provides a PVD chamber assembly for use in depositing metal particles onto a wafer placed inside the chamber assembly. The physical vapor deposition assembly includes a chamber having an opening, and a target containing a desired metal to be deposited on a wafer placed inside the chamber, with the target adapted to be secured at the opening of the chamber. The assembly further includes an insulator positioned along the boundary of the opening, and having opposing first and second surfaces, with the second surface having a ridge extending therealong and defining a narrow horizontal ridge surface. A first O-ring is positioned between the first surface of the insulator and the chamber along the boundary of the opening, and a second O-ring is positioned between the ridge surface of the insulator and the target.

Thus, the ridge provides a narrowed surface of the insulator for contacting the O-ring, thereby reducing the portions of the insulator surrounding the O-ring. This effectively reduces the potential for physical (i.e., side-to-side or abrasive) contact between the target and the insulator that might result in the embedding of metal particles from the target into the insulator, while at the same time maintaining an effective vacuum seal.

DETAILED DESCRIPTION OF THE INVENTION

Figure 1:
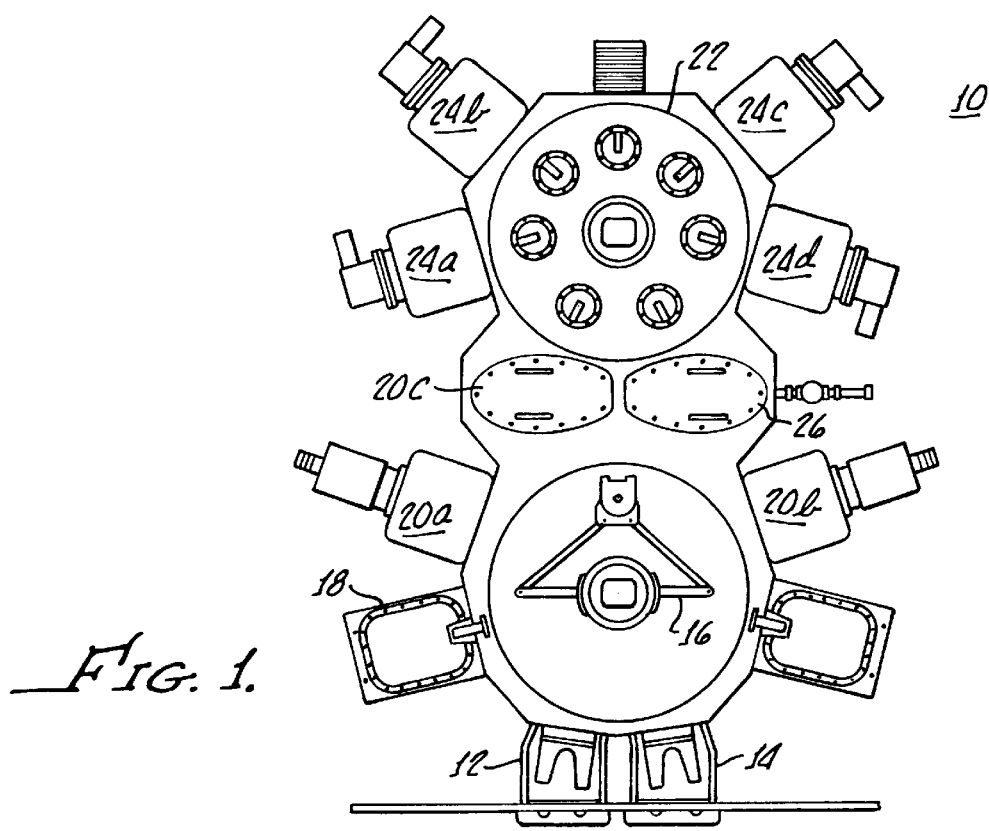
FIG. 1 is a top plan view of a conventional semiconductor wafer processing system.

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

The present invention provides a PVD chamber 124 having an insulator 144 with a narrow annular ridge 154 built into a top surface 156 of the insulator 144 that faces the target 132. The narrowed ridge 154 is adapted to provide a narrowed surface for contacting the O-ring 148, thereby minimizing the surface area of the insulator 144 that might potentially contact the target 132.

Figure 2:
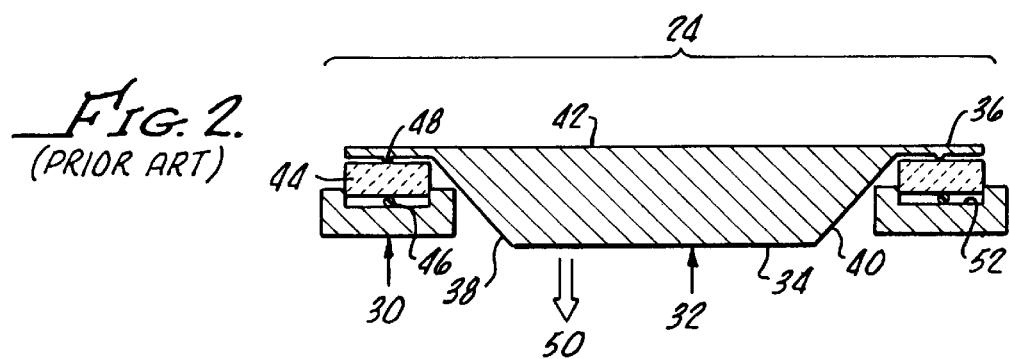
FIG. 2 is a cross-section view of the opening of a conventional PVD chamber.
Figure 3:
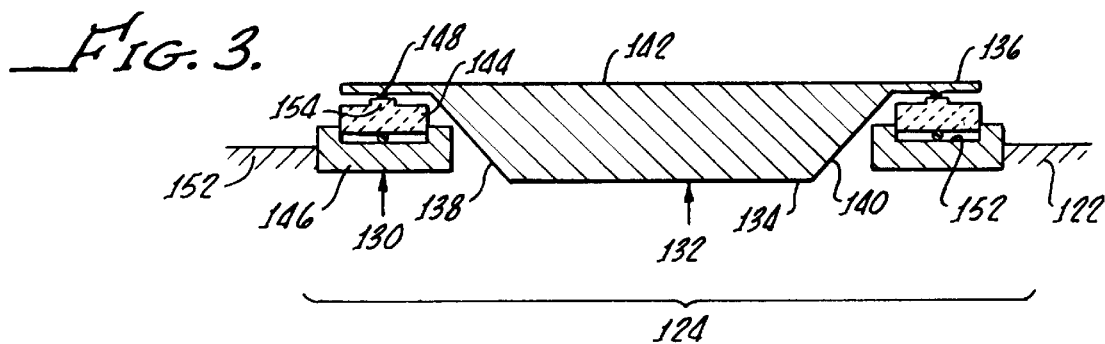
FIG. 3 is a cross-section view of the opening of a PVD chamber according to an embodiment of the present invention.
Figure 4:
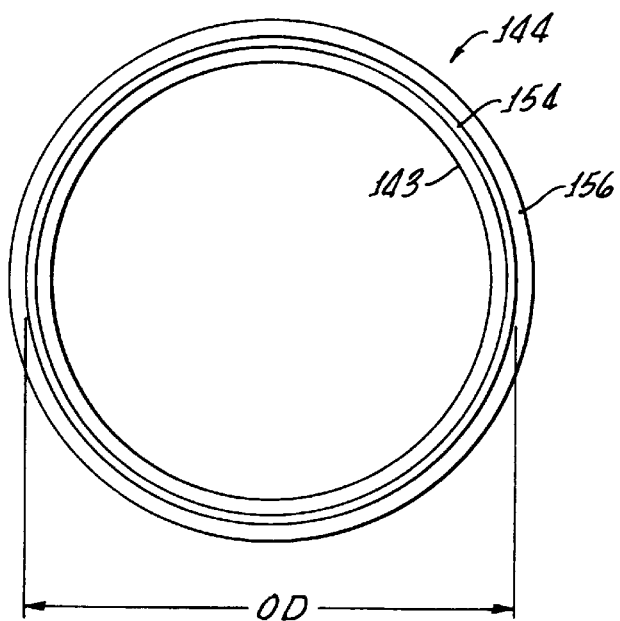
FIG. 4 is a top plan view of the insulator of the PVD chamber of FIG. 3.
Figure 5:
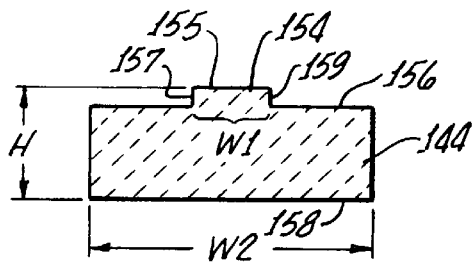
FIG. 5 is a cross-sectional view of the insulator of the PVD chamber of FIG. 3.
Figure 6:
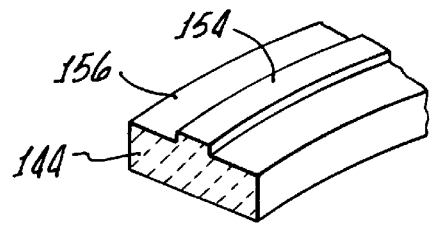
FIG. 6 is a perspective sectional view of the insulator of the PVD chamber of FIG. 3.

In particular, referring to FIGS. 3–6, the structure of the opening of the PVD chamber 124 illustrated in FIG. 3 is similar to the structure of the opening of the PVD chamber 24 of FIG. 2. The PVD chamber 124 may be used, for example, in the system 10 illustrated above by replacing the chambers 24 with the chambers 124 according to the present invention. In this regard, each PVD chamber 124 according to the present invention has a generally square configuration (with rounded corners) with a generally oblong opening or mouth that is defined by a spacer 130, which is typically bolted or otherwise attached to the wall 122 of the chamber 124. The spacer 130 can be made of the same materials as those described above for spacer 30. A target 132 is placed over the spacer 130. The target 132 is the metal that is to be sputtered for deposition onto the wafers, and examples of such metals can include those described above. The target 132 is provided in a generally circular shape having a trapezoidal central portion 134 and an annular flange 136. The central portion 134 has two inclined or angled walls 138, 140. The flange 136 is provided as an overhang to fit over the spacer 130, so that the central portion 134 can extend through the opening of the chamber 124 defined by the spacer 130. The target 132 can be provided in the form of one piece of the desired metal, or in a "diffusion bonded" manner, as described above. A fiberglass composite top is then provided over and bolted to the backing (i.e., the top 142) of the target 132.

An insulator 144 is provided between the target 132 and the spacer 130 to isolate the "cathode" (i.e., the spacer 132)

from the "anode" (i.e., the target 130). The insulator 144 is received inside a groove 152 provided in the spacer 130. This insulator 144 is preferably a high-density material that exhibits low "out-gassing" properties (i.e., emits little gas), has good insulative properties, retains minimal water, and has a low propensity for creating particles even after abrasive contact with another surface. Such a material can be a ceramic material, such as alumina. The insulator 144 has a top surface 156 that faces the flange 136 of the target 132, and an opposite bottom surface 158. A narrow annular ridge 154 is built into the top surface 156, and is adapted to seat a second O-ring 148 that is provided to separate the insulator 144 and the flange 136 of the target 132. The ridge has a generally horizontal top surface 155 and two vertical side walls 157 and 159. In addition, a first O-ring 146 is provided to separate the bottom surface 158 of the insulator 144 and the spacer 130.

The ridge 154 is sized and configured so that the second O-ring 148 can be seated entirely thereon without contacting any other part of the insulator 144. In this regard, the thickness or width W1 of the ridge 154 preferably has approximately the same dimension as the width or thickness of the O-ring 148, and the outer diameter OD of the annular ridge 154 preferably has approximately the same dimension as the outer diameter of the O-ring 148. In addition, the ridge 148 is preferably positioned relative to the placement of the O-ring in the flange 136. For example, the ridge 148 is usually not centered within the width W2 of the insulator 144, and can be positioned closer to the inner radius 143 of the insulator 144 if a smaller insulator 144 is provided, or positioned closer to the center of the width W2 if a larger insulator 144 is provided.

Thus, the present invention has in effect taken the desired position of the O-ring 148 along the top surface 156 of the insulator 144, and has reduced the portions of the insulator 144 surrounding the desired position of the O-ring 148. This effectively reduces the potential of physical (i.e., side-to-side or abrasive) contact between the flange 136 of the target 132 and the insulator 144. For example, as illustrated in FIG. 3, even if the O-ring 148 becomes compressed, the raised nature of the ridge 154 will still separate the flange 136 from the top surface 156 of the insulator 144. Even if the compression of the O-ring 148 onto the ridge 154 is not uniform, then the maximum amount of potential contact between the flange 136 and the insulator 144 is defined by the surface area of the top surface 155 of the ridge 154, which is a much smaller surface area than the entire top surface 156 of the insulator 144. In reality, the compressed O-ring 148 will cover a large part, if not most, of the top surface 155 of the ridge 154, so that there will be negligible, if any, contact between the flange 136 and the top surface 155 of the ridge 154. In this manner, the vacuum seal is still maintained at the location of the ridge 154 and the O-ring 148.

According to one embodiment of the present invention, the ridge 154 can be formed by removing the portions of the insulator 144 surrounding the desired position of the O-ring 148. This can be accomplished during the manufacture of the insulator 144 by machining or extruding the piece of material that makes up the insulator 144. Thus, according to this embodiment, the combined height H of the insulator 144 and its ridge 154 will be the same the height of the currently-available insulator 44.

Although the ridge 154 is illustrated as having a generally horizontal top surface 155 and two vertical side walls 157 and 159, the configuration of the ridge 154 can be modified as long as a generally horizontal top surface 155 is provided.

Figure 7:
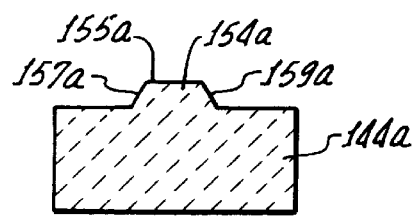
FIG. 7 is a cross-sectional view of an alternative insulator that can be used with the PVD chamber of FIG. 3.

For example, FIG. 7 illustrates an alternative insulator 144a in which the ridge 154a has a generally horizontal top surface 155a and two angled side walls 157a and 159a.

Although certain components, subsystems, and blocks have been described above as including certain elements, it will be appreciated by those skilled in the art that such disclosures are non-limiting, and that different elements, or combinations thereof, can be provided for such components, subsystems, and blocks without departing from the spirit and scope of the present invention.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A physical vapor deposition chamber assembly for use in depositing metal particles onto a wafer placed inside the chamber assembly, the assembly comprising:

a chamber having an opening, the opening defining a boundary;

a target containing a desired metal to be deposited on a wafer placed inside the chamber, the target adapted to be secured at the opening of the chamber;

an insulator positioned along the boundary of the opening, and having opposing first and second surfaces, the second surface having a ridge extending therealong and defining a narrow horizontal ridge surface;

a first O-ring positioned between the first surface of the insulator and the chamber along the boundary of the opening; and a second O-ring positioned between the ridge surface of the insulator and the target.

2. The assembly of claim 1, further including a spacer provided along the boundary of the opening, with the first O-ring positioned between the first surface of the insulator and the spacer.

3. The assembly of claim 2, wherein the spacer further includes a groove for receiving the first O-ring and a portion of the insulator.

4. The assembly of claim 1, wherein the insulator is circular.

5. The assembly of claim 4, wherein the ridge is circular and is positioned at about the center of the width of the insulator.

6. The assembly of claim 1, wherein the ridge is formed by removing portions of the insulator surrounding the position of the second O-ring.

7. The assembly of claim 1, wherein the ridge has a width that is approximately the same as the width of the second O-ring.

8. The assembly of claim 1, wherein the ridge and second O-ring together form a vacuum seal.

9. The assembly of claim 1, wherein the target includes a central portion and an annular flange, with the annular flange supporting the target over the boundary of the opening.

10. The assembly of claim 9, wherein the second O-ring is positioned between the ridge surface of the insulator and the annular flange.

11. The assembly of claim 1, wherein the insulator is made of ceramic.

12. The assembly of claim 1, wherein the ridge further includes a pair of vertical side walls connecting the ridge surface and the second surface of the insulator.

13. The assembly of claim 1, wherein the ridge further includes a pair of angled side walls connecting the ridge surface and the second surface of the insulator.

14. A semiconductor wafer processing assembly, comprising at least one wafer load lock, an orient and de-gas chamber, at least one physical vapor deposition chamber assembly, and a cool chamber, wherein the physical vapor deposition chamber assembly comprises:

a chamber having an opening, the opening defining a boundary;

a target containing a desired metal to be deposited on a wafer placed inside the chamber, the target adapted to be secured at the opening of the chamber;

an insulator positioned along the boundary of the opening, and having opposing first and second surfaces, the second surface having a ridge extending therealong and defining a narrow horizontal ridge surface;

a first O-ring positioned between the first surface of the insulator and the chamber along the boundary of the opening; and a second O-ring positioned between the ridge surface of the insulator and the target.

15. The assembly of claim 14, further including a spacer provided along the boundary of the opening, with the first O-ring positioned between the first surface of the insulator and the spacer.

16. The assembly of claim 15, wherein the spacer further includes a groove for receiving the first O-ring and a portion of the insulator.

17. The assembly of claim 14, wherein the insulator is circular.

18. The assembly of claim 17, wherein the ridge is circular and is positioned at about the center of the width of the insulator.

19. The assembly of claim 14, wherein the ridge is formed by removing portions of the insulator surrounding the position of the second O-ring.

20. The assembly of claim 14, wherein the ridge has a width that is approximately the same as the width of the second O-ring.

21. The assembly of claim 14, wherein the ridge and second O-ring together form a vacuum seal.

22. The assembly of claim 14, wherein the target includes a central portion and an annular flange, with the annular flange supporting the target over the boundary of the opening.

23. The assembly of claim 22, wherein the second O-ring is positioned between the ridge surface of the insulator and the flange.

24. The assembly of claim 14, wherein the insulator is made of ceramic.

25. The assembly of claim 14, wherein the ridge further includes a pair of vertical side walls connecting the ridge surface and the second surface of the insulator.

26. The assembly of claim 14, wherein the ridge further includes a pair of angled side walls connecting the ridge surface and the second surface of the insulator.

27. A method of manufacturing a physical vapor deposition chamber assembly that is adapted for use in depositing metal onto a wafer placed inside the chamber assembly, the method comprising the steps of:

a. providing a chamber having an opening, the opening defining a boundary;

b. positioning an insulator along the boundary of the opening;

c. positioning a first O-ring between a first surface of the insulator and the chamber along the boundary of the opening;

d. providing a narrowed contact surface on a second surface of the insulator;

e. providing a ridge extending along the second surface of the insulator and defining a narrow horizontal ridge surface;

f. securing a target at the opening of the chamber, the target containing a desired metal to be deposited on a wafer placed inside the chamber; and g. positioning a second O-ring between the narrowed contact surface of the insulator and the target.

28. The method of claim 27, wherein step (g) further includes the step of forming a vacuum seal at the ridge and second O-ring.

* * * * *